(12) United States Patent
Kalgutkar et al.

(10) Patent No.: US 7,935,540 B2
(45) Date of Patent: May 3, 2011

(54) WATER-SOLUBLE POLYMERIC SUBSTRATE HAVING METALLIC NANOPARTICLE COATING

(75) Inventors: Rajdeep S. Kalgutkar, Woodbury, MN (US); Donald J. McClure, Siren, WI (US); Mario A. Perez, Burnsville, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 574 days.

(21) Appl. No.: 11/995,299

(22) PCT Filed: Jul. 14, 2005

(86) PCT No.: PCT/US2005/024976
§ 371 (c)(1),
(2), (4) Date: Jan. 10, 2008

(87) PCT Pub. No.: WO2007/011331
PCT Pub. Date: Jan. 25, 2007

(65) Prior Publication Data
US 2009/0130778 A1    May 21, 2009

(51) Int. Cl.
*G01N 33/553* (2006.01)
(52) U.S. Cl. ........ 436/525; 436/524; 436/531; 436/805; 422/82.11
(58) Field of Classification Search .................. None
See application file for complete search history.

(56) References Cited

U.S. PATENT DOCUMENTS

| | | | |
|---|---|---|---|
| 4,772,663 A | 9/1988 | Marten et al. | |
| 4,867,881 A | 9/1989 | Kinzer | |
| 4,948,857 A | 8/1990 | Marten et al. | |
| 5,203,884 A | 4/1993 | Buchanan et al. | |
| 5,238,623 A | 8/1993 | Mrozinski | |
| 5,427,835 A | 6/1995 | Morrison et al. | |
| 5,527,712 A * | 6/1996 | Sheehy ................ | 436/525 |
| 5,656,333 A | 8/1997 | Truong et al. | |
| 5,774,619 A | 6/1998 | Bruesselbach | |
| 5,922,403 A | 7/1999 | Tecle | |
| 5,928,517 A | 7/1999 | Smith et al. | |
| 6,042,959 A | 3/2000 | Debe et al. | |
| 6,344,272 B1 | 2/2002 | Oldenburg et al. | |
| 6,383,612 B1 | 5/2002 | Waller, Jr. et al. | |
| 6,411,748 B1 | 6/2002 | Foltzer | |
| 6,416,818 B1 | 7/2002 | Aikens et al. | |
| 6,425,993 B1 | 7/2002 | Debe et al. | |
| 6,514,599 B1 | 2/2003 | Ali et al. | |
| 6,537,650 B1 | 3/2003 | Waller, Jr. et al. | |
| 6,576,354 B2 | 6/2003 | Tsukatani et al. | |
| 6,592,945 B2 | 7/2003 | Suzuki et al. | |
| 6,642,295 B2 | 11/2003 | Border et al. | |
| 6,773,926 B1 | 8/2004 | Freund et al. | |
| 6,805,940 B2 | 10/2004 | Koskenmaki et al. | |
| 6,816,125 B2 | 11/2004 | Kuhns et al. | |
| 6,838,486 B2 | 1/2005 | Ryang | |
| 6,875,465 B2 | 4/2005 | Bishop et al. | |
| 7,002,697 B2 | 2/2006 | Domash et al. | |
| 7,030,989 B2 | 4/2006 | Yager et al. | |
| 7,237,330 B2 | 7/2007 | Koskenmaki et al. | |
| 7,259,100 B2 | 8/2007 | Zurcher et al. | |
| 7,274,458 B2 | 9/2007 | Perez et al. | |
| 7,332,101 B2 * | 2/2008 | Singh et al. ............ | 252/62.51 R |
| 2002/0142306 A1 | 10/2002 | Coleman et al. | |
| 2003/0165680 A1 | 9/2003 | Brady et al. | |
| 2003/0170687 A1 | 9/2003 | Chilkoti et al. | |
| 2003/0174384 A1 | 9/2003 | Halas et al. | |
| 2003/0203222 A1 | 10/2003 | Phillips et al. | |
| 2004/0131799 A1 | 7/2004 | Arsenault et al. | |
| 2005/0259300 A1 | 11/2005 | Burberry et al. | |
| 2006/0251874 A1 | 11/2006 | McClure et al. | |

FOREIGN PATENT DOCUMENTS

| | | |
|---|---|---|
| EP | 1 130 051 A2 | 9/2001 |
| EP | 1 300 435 | 4/2003 |
| EP | 1 300 435 A1 | 4/2003 |
| WO | WO 98/10289 A1 | 3/1998 |
| WO | WO 99/05315 A2 | 2/1999 |
| WO | WO 00/34033 A1 | 6/2000 |
| WO | WO 02/087749 A1 | 11/2002 |
| WO | WO 03/093809 A1 | 11/2003 |
| WO | WO 03/106573 A1 | 12/2003 |
| WO | WO 2005/008243 | 1/2005 |
| WO | WO 2005/008243 A1 | 1/2005 |
| WO | WO 2008/024125 A2 | 2/2008 |

OTHER PUBLICATIONS

Lu, et al., "High Density Silver Nanoparticle Film with Temperature-Controllable Interparticle Spacing for a Tunable Surface Enhanced Raman Scattering Substrate," Nano Letters, vol. 5, No. 1, 5-9, 2005, pp. 5-9.

Akamatsu et al., "In Situ Spectroscopic and Microscopic Study on Dispersion of Ag Nanoparticles in Polymer Thin Films", J. Phys. Chem. B, (2000), pp. 10168-10173, vol. 104, American Chemical Society.

Biswas et al., "Polymer-Metal Optical Nanocomposites with Tunable Particle Plasmon Resonance Prepared by Vapor Phase Co-Deposition", Materials Letters, (2004), pp. 1530-1534, vol. 58, Elsevier B.V.

Blackborow et al., "Metal Vapour Synthesis in Organometallic Chemistry", (1979), Springer-Verlag Berlin.

Holland, "Vacuum Deposition of Thin Films", (1970), 6$^{th}$ Printing, Chapman and Hall Ltd.

(Continued)

*Primary Examiner* — Christopher L Chin
(74) *Attorney, Agent, or Firm* — Kent S. Kokko

(57) ABSTRACT

A metallic nanoparticle coated water-soluble polymeric substrate and the process for preparing and using the same is described.

21 Claims, 2 Drawing Sheets

OTHER PUBLICATIONS

Kunz et al., "Morphologies of Discontinuous Gold Films on Amorphous Polymer Substrates", J. Appl. Phys. (1992), pp. 4458-4460, vol. 72, No. 9, American Institute of Physics.

Lu et al., "High-Density Silver Nanoparticle Film with Temperature-Controllable Interparticle Spacing for a Tunable Surface Enhanced Raman Scattering Substrate", Nano Letters, (2005) pp. 5-9, vol. 5, No. 1, American Chemical Society.

Pattabi et al., "Electrical Behaviour of Discontinuous Silver Films Deposited on Softened Polyvinylpyridine Substrates", J. Phys. D: Appl. Phys., (1998), pp. 19-23, vol. 31, IOP Publishing Ltd.

Subramanian et al., "A Novel Technique for Synthesis of Silver Nanoparticles by Laser-Liquid Interation", Journal of Materials Science, (1998), pp. 3417-3477, vol. 33.

Yatsuya et al., "A New Technique for the Preparation of Extremely Fine Metal Particle", Japan. J. Appl. Phys., (1974), pp. 749-750, vol. 13, No. 4.

Zheng et al., "Optical Properties of Silver-Dispersed PVP Thin Film", Materials Research Bulletin, (2001), pp. 853-859, vol. 36, Elsevier Science Ltd.

* cited by examiner

- PVOH/Silver Oxide Nanoparticle dissolved in water (original solution)
- Original solution diluted to 50%
- Original solution diluted to 25% ary fields. This resonance can be dominated by absorption or scattering depending on the radius of the nanoparticle with respect to the wavelength of the incident electromagnetic radiation. Associated with this plasmon resonance is a strong local field enhancement in the interior of the metal nanoparticle. A variety of potentially useful devices can be fabricated to take advantage of these specific optical properties. For example, optical filters or chemical sensors based on surface enhanced Raman scattering (SERS) have been fabricated.

WATER-SOLUBLE POLYMERIC SUBSTRATE HAVING METALLIC NANOPARTICLE COATING

CROSS REFERENCE TO RELATED APPLICATIONS

This application is a national stage filing under 35 U.S.C. 371 of PCT/US2005/024976, filed Jul. 14, 2005, now Publication No. WO 2007/011331 A2, the disclosure of which is incorporated by reference in its/their entirety herein.

FIELD OF THE INVENTION

The present invention is directed to a metallic nanoparticle coated water-soluble polymeric substrate and the process for preparing and using the same.

BACKGROUND

Metallic nanoparticles, having a diameter of about 1-100 nanometers (nm), are important materials for applications that include semiconductor technology, magnetic storage, electronics fabrication, and catalysis. Metallic nanoparticles have been produced by gas evaporation; by evaporation in a flowing gas stream; by mechanical attrition; by sputtering; by electron beam evaporation; by thermal evaporation; by electron beam induced atomization of binary metal azides; by expansion of metal vapor in a supersonic free jet; by inverse micelle techniques; by laser ablation; by laser-induced breakdown of organometallic compounds; by pyrolysis of organometallic compounds; by microwave plasma decomposition of organometallic compounds, and by other methods.

It is known that metallic nanoparticles possess unique optical properties. In particular, metallic nanoparticles display a pronounced optical resonance. This so-called plasmon resonance is due to the collective coupling of the conduction electrons in the metal sphere to the incident electromagnetic field. This resonance can be dominated by absorption or scattering depending on the radius of the nanoparticle with respect to the wavelength of the incident electromagnetic radiation. Associated with this plasmon resonance is a strong local field enhancement in the interior of the metal nanoparticle. A variety of potentially useful devices can be fabricated to take advantage of these specific optical properties. For example, optical filters or chemical sensors based on surface enhanced Raman scattering (SERS) have been fabricated.

U.S. Pat. No. 6,344,272 (Oldenburg et al.) describes nanoparticles comprised of a nonconducting inner layer that is surrounded by an electrically conducting material. The ratio of the thickness of the nonconducting layer to the thickness of the outer conducting shell is determinative of the wavelength of maximum absorbance or scattering of the particle. The reference notes that a serious practical limitation to realizing many applications of solid metal nanoparticles is the inability to position the plasmon resonance at desired wavelengths. For example, solid gold nanoparticles of 10 nm in diameter have a plasmon resonance centered at 520 nm. This plasmon resonance cannot be controllably shifted by more than approximately 30 nanometers by varying the particle diameter or the specific embedding medium.

Surface Plasmon Resonance (SPR) is the resonant excitation of oscillating free charges at the interface of a metal and a dielectric. When SPR spectra are generated and collected, they can be used to determine specificity, kinetics, affinity, and concentration with respect to the interactions between two or more molecules, where one of the molecules is attached to a solid sensing surface. Reaction kinetics corresponds to both an association and a dissociation rate at which an analyte interacts with the bound detection molecule. Affinity refers to the strength with which an analyte binds to the detecting molecule. Specificity refers to the propensity of a molecule to bind to the detecting molecule to the exclusion of other molecules. SPR spectra have been used in studies involving many types of molecules including proteins, peptides, nucleic acids, carbohydrates, lipids, and low molecular weight substances (e.g., hormones and pharmaceuticals).

SPR based bio-sensing, has been developed to enable direct measurements of the association of ligands with receptors, without the use of indirect labels, such as fluorescent markers and radioactive molecular tags. This label free direct sensing technique reduces the time and workload required to perform assays, and minimizes the risk of producing misleading results caused by molecular changes induced by the use of indirect labels. Another important aspect of the bio-sensing technique is that SPR based bio-sensing enables bio-molecular interactions to be measured continuously and in real-time, thereby enabling the determination of association and dissociation kinetic data in contrast to traditional "end point" analytical methods.

Recently, sensor devices have been developed in the known art to exploit the unique optical properties of these nanoparticles. SPR measurements have been made using gold nanoparticle suspensions to detect biomolecular interactions in real time by monitoring the absorbance of colloidal suspensions.

Over the past decade, interest in the unique optical properties of metallic nanoparticles has increased considerably with respect to the use of suspensions and films incorporating these nanoparticles for the purposes of exciting surface plasmons to enable the detection of SPR spectra. In addition, Surface Enhanced Raman Spectroscopy (SERS) for infrared absorbance spectral information and surface enhanced fluorescence for enhanced fluorescence stimulation can also be detected. Nanoparticles are particles that are less than 100 nanometers in diameter. Metallic nanoparticles display large absorbance bands in the visible wavelength spectrum yielding colorful colloidal suspensions. The physical origin of the light absorbance is due to incident light energy coupling to a coherent oscillation of the conduction band electrons on the metallic nanoparticle. This coupling of incident light is unique to discrete nanoparticles and films formed of nanoparticles (referred to as metallic island films). Achieving SPR with ordinary bulk materials requires the use of a prism, grating, or optical fiber to increase the horizontal component of the incident light wave vector (i.e., to achieve the required coupling).

SUMMARY

The present invention overcomes limitations of the prior art by providing a water-soluble polymer substrate having a discontinuous metallic nanoparticle coating. By "metallic" it is meant elemental metals and compounds thereof, such as oxides. "Water soluble" means that the polymer will completely dissolve upon extended contact with water. Nonlimiting types of water soluble polymers are those film forming polymers having the requisite water solubility and include poly(vinyl alcohol), poly(aspartic acid), poly(acrylic acid), poly(methacrylic acid), poly(acrylamide), poly(vinyl pyrrolidone), poly(alkylene oxide)s, complex carbohydrates, and combinations thereof as copolymers, blends, mixtures, and the like. While films of water-soluble polymers are preferred, other structures such as sheets, fibers, nonwovens, membranes and microporous articles may also be used as the water-soluble polymer substrate.

The article of the present invention per se could be used in such diverse applications as optical switching devices, optical communication systems, infrared detectors, infrared cloaking devices, chemical sensors, passive solar radiation collection or deflecting devices and the like. Providing a multilayer article comprising two or more layers of the nanoparticle coated water-soluble polymer film substrates may also increase the intensity of the absorbance spectrum.

Most significantly, the articles provide a convenient, stable storage article for nanoparticles, and which may be used in preparing stable, aqueous nanoparticle dispersions without the use of reducing agents and stabilization agents that can deleteriously affect the optical properties of the suspension and may contaminate the ultimate substrate surface. The stable aqueous suspensions may be prepared by contacting the article with water. The suspensions may then be used to prepare nanoparticle-coated articles by contacting a suitable secondary substrate, such as glass, with the dispersions.

In one embodiment the invention provides a method of preparing a nanoparticle coated water soluble polymer substrate surface comprising the steps of providing a water soluble film and depositing a discontinuous coating of metallic nanoparticle on the surface of the film by physical vapor deposition. The water-soluble polymer substrate may be stretched before or after deposition, and if stretched, may be shrunk after deposition. Advantageously, the method allows continuous production of nanoparticle-coated articles.

In another embodiment, the invention provides an optical article exhibiting surface plasmon resonance comprising the metallic nanoparticle-coated water soluble polymer substrate, wherein the absorption peak maximum may be adjusted (i.e. shifted to longer or shorter wavelengths) by stretching (e.g. orientation) or shrinking of the article. The light at a certain wavelength and certain angle will enter in resonance with the surface plasmons and the photon will be absorbed. This is seen by a maximum in the absorbance spectra. The absorption spectrum is a function of the degree of stretching or shrinking, the nature of the metal, the size of the nanoparticles, the average coating thickness, and the dielectric constant of the thermoplastic polymer substrate layer.

In another embodiment the invention provides a sensor comprising the metallic nanoparticle coated water soluble polymer substrate, wherein a binding agent disposed over at least a portion of said metallic nanoparticle and wherein said binding agent interacts with a predetermined substance present in said biological, biochemical, chemical or environmental sample.

Various features, embodiments and advantages of the invention will be apparent from the following detailed description of the invention and the claims. The above summary is not intended to describe each illustrated embodiment or every implementation of the present disclosure. The detailed description that follows more particularly exemplifies certain preferred embodiments utilizing the principles disclosed herein.

DETAILED DESCRIPTION

Figure 1:
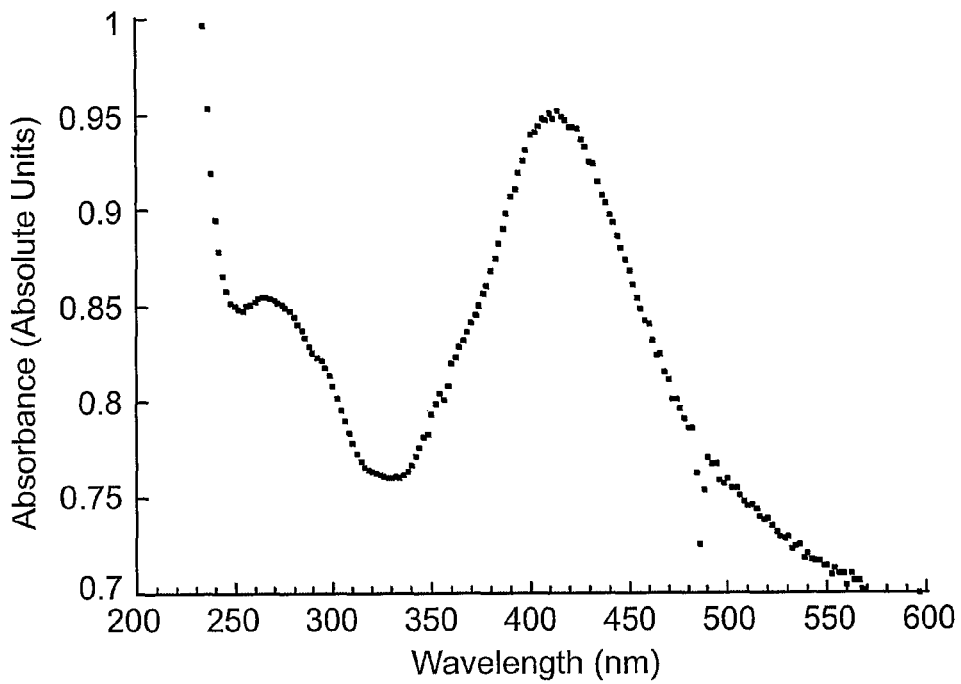
FIGS. 1 to 3 are absorbance spectra from Example 1

The invention is directed to an article comprising a water-soluble polymer substrate and a discontinuous metallic nanoparticle coating on the water-soluble polymer substrate. Depositing a discontinuous layer of metallic nanoparticles by a physical vapor deposition method forms the coating. The majority of the metal nanoparticles are usually elemental metal nanoparticles, although other metallic nanoparticle such as oxides are also contemplated. When contacted with water, the water-soluble polymer substrate dissolves yielding a stable dispersion of metallic nanoparticles that may be used to prepare other nanoparticle coated articles using secondary substrates.

The present invention is directed, in part, to methods of forming a nanoparticle coating on a water-soluble polymer substrate. The methods include providing a water soluble polymer film, onto which is deposited a discontinuous coating of metallic nanoparticles of an average size less than 100 nanometers by physical vapor deposition. As used herein, "discontinuous" means the nanoparticle coating is disposed as islands of nanoparticles or agglomerates thereof, surrounded by uncoated areas, such that the coating exhibits surface plasmon resonance. Continuous coatings, regardless of thickness, do not yield surface plasmon resonance.

The present invention provides a metallic nanoparticle coating on a water-soluble polymeric polymer substrate, the nanoparticles having a mean number average particle diameter in the range of 1 to 100 nanometers and most preferably 1 to 50 nanometers. The coating generally has an average thickness of less than 100 nanometers, preferably less than 10 nanometers. The nanoparticles may be substantially spherical, but in some cases are elongated, having an aspect ratio (length to diameter) of greater than 1.5:1 (i.e. are substantially oblong). Optionally, the polymer substrate is stretched (oriented) prior to deposition, and may subsequently be further stretched or shrunk to shift the absorbance peak maximum to the desired degree.

Average thickness of the nanoparticle coating may be measured during deposition using a commercially available quartz crystal microbalance. After deposition a number of chemical assays can be used to characterize the quantity of metal in any specified area. Particle diameter (formed by agglomeration of the nanoparticles) is typically measured using light scattering techniques known in the art. Primary particle diameter is typically measured using transmission electron microscopy or atomic force microscopy.

The coated article allows the optical properties to be varied by stretching or shrinking. As the article is stretched or shrunk, the absorbance spectrum maximum is shifted to shorter or longer wavelengths respectively, so the optical properties may be varied as desired. In optical filter applications, this enables one to adjust the absorbance to a preselected maximum, so as to most efficiently filter out undesired wavelengths such as ultraviolet or infrared wavelengths. In sensor applications, it allows one to match the absorbance peak maximum to a particular analyte and thereby maximize the response signal.

The water-soluble polymer is generally selected from those polymers having the requisite water solubility, they form stable dispersions with the metallic nanoparticles and are film formers. The term "film-forming polymer" means that the polymer particles in dispersion or solution coalesce to provide a continuous, preferably transparent, essentially nonporous polymer film when dried. A test for coalescence is to coat a thin film of the polymer onto a transparent substrate using an 11% polymer dispersion, drying and observing for clarity and continuity of coating. A film-forming polymer will preferably yield a transparent or nearly transparent film. It will be understood that the water soluble polymer useful as a substrate for nanoparticle deposition need not be in the form of a film as other physical forms including sheets, fibers, porous and microporous films and nonwovens are contemplated.

Water-soluble polymers useful in the article invention are basically of two general classes, natural or synthetic. Naturally occurring water-soluble polymers have been known for many years. Many are obtained from seeds, seaweeds or as exudates from trees, and have been extensively used as thickening agents in cosmetics, pharmaceuticals, etc. Water-soluble polymers obtained from natural sources normally require little processing other than collection, grading, extraction, or purification, although minor chemical modifications are sometimes carried out to improve their properties. Examples of natural water-soluble polymers include guar gum, gum arabic, gum tragacanth, larch gum, gum karaya, locust bean gum, agar, alginates, caragheenan, pectins, and gelatin.

Synthetic water-soluble polymers include the modified (or semisynthetic) polymers that are derivatives of cellulose and those that are completely synthetic. Cellulose is not water soluble without modification. However, a broad spectrum of products with varying degrees of water solubility may be synthesized by varying the molecular weight of the cellulose and the type and extent of substitution. Typical cellulose derivatives include methyl, hydroxyethyl, sodium carboxymethyl and combinations thereof.

Synthetic water-soluble polymers can be prepared by direct polymerization of suitable monomers. Poly(vinylpyrrolidone), poly(acrylic acid), poly(acrylamide), poly(vinyl methyl ether), poly(ethylene oxide), poly(ethyleneimine), and sulfonated polyesters are all water soluble polymers synthesized by direct polymerization.

Exemplary water soluble polymers include polyvinyl alcohol, hydroxymethyl cellulose (Methocel™, Dow Chemical), hydroxypropyl cellulose (Klucel™, Aqualon, Inc.), carboxylated polyvinyl acetate (Daratek™ RP-200, W. R. Grace & Co.), poly(methyl vinyl ether-co-maleic anhydride) (Gantrez™, GAF Inc.), alignic acid derivatives (Algin™, Kelco, Inc.), poly(N-vinyl pyrrolidone), and polyacrylic acid, or mixtures thereof. Useful sulfonated polyester-based resins include, but are not limited to, ones taught in, e.g., U.S. Pat. No. 5,427,835 (Morrison et al.) and U.S. Pat. No. 5,203,884, incorporated herein by reference.

The preferred water-soluble polymer is polyvinyl alcohol that typically is formed by partial hydrolysis of polyvinyl acetates. The solubility of the polyvinyl alcohol can be adjusted by the percent hydrolysis with the most soluble polymers having a degree of hydrolysis of from 79 to 95% preferably 85 to 90% with a molar vinyl acetate content of from 12 to 80 percent with the remainder being vinyl alcohol units. The polyvinyl alcohol molecular weight is preferably from 10,000 to 200,000, more preferably 10,000 to 50,000.

Most preferably the water-soluble polymer substrate is a vinyl alcohol polymer film, including poly(vinyl alcohol). Vinyl alcohol polymers include any linear 1,3-polyhydroxylated polymer or copolymer. Having the requisite water-solubility. Useful vinyl alcohol polymers include polymers and copolymers of units of the formula:

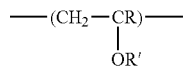

wherein R is H, a $C_1$-$C_8$ alkyl, or an aryl group; and R' is H, or a hydrolysable functional group such as a $C_1$-$C_8$ acyl group. Preferably, R and R' are H. In addition to poly(vinyl alcohol) polymers and copolymers, specifically contemplated are polyvinyl acetals and ketals and esters. Useful co-monomers that may be polymerized with the vinyl alcohol monomers to produce vinyl alcohol copolymers may include any free-radically polymerizable monomers including olefins, such as ethylene, propylene and butylene, acrylates and methacrylates such as methyl (meth)acrylate, vinyl acetates and styrenes. Specifically contemplated for use in the present invention are copolymers of ethylene and vinyl alcohol. The amount of co-monomer is insufficient to deleteriously affect the water-solubity. Generally the amount of co-monomers is less than 30 mole % and is preferably less than 10 mole %.

The preferred vinyl alcohol polymers are homo- and copolymers of polyvinyl alcohol. Most preferred are polyvinyl alcohol homopolymers. Commercially available polyvinyl alcohols, such as those available from Celanese Chemicals, Inc., Dallas, Tex., under the tradename CELVOL™, and SOLUBLON™ from Mitsui Plastics, White Plains, N.Y. Polyvinyl alcohols having low viscosities are preferred for ease of coating, while having a sufficiently high molecular weight to provide adequate moisture resistance and good mechanical properties.

Melt-processable polyvinyl alcohol may also be used in this invention. The melt processible vinylalcohol polymers are plasticized to enhance their thermal stability and allow them to be extruded or melt-processed. The plasticizer can be added externally or in the vinyl alcohol polymer chain, i.e., the plasticizer is polymerized or grafted onto the vinylalcohol polymer backbone.

Vinyl alcohol polymers that can be externally plasticized include commercially available products such as Mowiol™ 26-88 and Mowiol™ 23-88 vinyl alcohol polymer resin available from Clariant Corp., Charlotte, N.C. These Mowiol™ vinyl alcohol polymer resins have a degree of hydrolysis of 88%. Mowiol™ 26-88 vinyl alcohol polymer resin has a degree polymerization of 2100 and a molecular weight of about 103,000.

Plasticizers useful in externally plasticizing vinyl alcohol polymer are high boiling, water-soluble, organic compounds having hydroxyl groups. Examples of such compounds include glycerol, polyethylene glycols such as triethylene glycol and diethylene glycol, trimethylol propane, and combinations thereof. Water is also useful as a plasticizer. The amount of plasticizer to be added varies with the molecular weight of the vinyl alcohol polymer. In general, the plasticizer will be added in amounts of between about 5% to about 30%, and preferably between about 7% to about 25%. Lower molecular weight vinyl alcohol polymers typically require less plasticizer than higher molecular weight vinyl alcohol polymers. Other additives for compounding externally plasticized vinyl alcohol polymers include processing aids (e.g. Mowilith™ DS resin from Hoechst A. G.), anti-blocking agents (e.g. stearic acid, hydrophobic silica), colorants, and the like.

Externally plasticized vinylalcohol polymers are compounded by slowly adding the organic plasticizer (and typically water) to the vinylalcohol polymer powder or pellets under constant mixing until the plasticizer is incorporated into the vinyl alcohol polymer, which occurs when the batch reaches a temperature of from about 82° C. (180° F.) to about 121° C. (250° F.). The lower the molecular weight of the vinylalcohol polymer resin, the lower the maximum batch temperature required to incorporate the plasticizer. The batch is held at that temperature for about 5 to 6 minutes. The batch is then cooled to about between 71° C. (160° F.) and 93° C. (200° F.) at which time an antiblocking agent can be added.

The batch is further cooled to about 66° C. (150° F.) at which time the vinyl alcohol polymer granulates can be removed from the mixer and extruded.

The compounding steps used to externally plasticize the vinylalcohol polymer can be eliminated when an internally plasticized vinylalcohol polymer is made except where it is desirable to add colorants, etc. Useful internally plasticized vinylalcohol polymers are commercially available. Such products include Vinex™ 2034 and Vinex™ 2025, both available from Air Products, Inc.

The Vinex trademark from Celanese represents a unique family of thermoplastic, water-soluble, polyvinylalcohol resins. Specifically, the "Vinex" 2000 series including Vinex™ 2034 and Vinex™ 2025 represent internally plasticized cold and hot water soluble polyvinyl alcohol copolymer resins. Such internally plasticized vinyl alcohol copolymers are described in U.S. Pat. No. 4,948,857 herein incorporated by reference. Such copolymers have the following general formula:

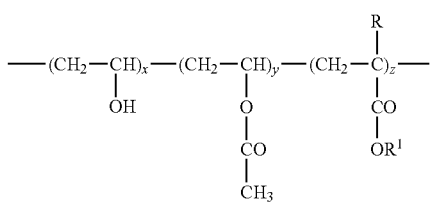

where R is hydrogen or methyl;
$R^1$ is a $C_6$-$C_{18}$ acyl group
y is 0 to 30 mole %;
z is 0.5 to 8 mole %; and
x is 70 to 99.5 mole %.

As stated in U.S. Pat. No. 4,948,857 these copolymers are easy to prepare and offer a polymer having good thermoplastic and thermal stability properties. These copolymers retain the strength properties of poly(vinylalcohol) while also exhibiting increased flexibility. The acrylate monomer represented in the above formula gives the copolymer its internal plasticization effect. The degree of polymerization of the copolymers can range from about 100 up to 2500, but is preferably between about 200 and 800. The degree of polymerization is defined as the ratio of molecular weight of the total polymer to the molecular weight of the unit as referenced in Formula I. Other internally plasticized poly(vinylalcohol) copolymer resins and preparation of these resins are discussed in U.S. Pat. No. 4,772,663. VINEX™ 2034 resin has a melt index typically of about 8.0 g/10 mins. and a glass transition temperature of about 30° C. (86° F.). VINEX™ 2025 resin has a melt index typically of 24 g/10 mins and a glass transition temperature of about 29° C. (84° F.).

Polyvinyl alcohols and copolymers thereof, are commercially available with varying degrees of hydrolysis, i.e., from about 50% to 99.5+%. Preferred polyvinyl alcohols have a degree of hydrolysis of about 80-99%. In general, the higher the degree of hydrolysis, the higher the solubility. Higher molecular weight polyvinyl alcohols also have better moisture resistance, but increased viscosity. In the practice of the invention, it is desirable to find a balance of properties in which the polyvinyl alcohol has sufficient solubility, and can be handled easily in the nanoparticle deposition process and can be readily oriented if desired. Most commercial grades of poly(vinylalcohol) contain several percent residual water and unhydrolyzed poly(vinyl acetate).

The nanoparticles may be prepared by physical vapor deposition techniques wherein metal is heated under reduced pressure until vaporization occurs. Optionally, the metal vaporizes in the presence of a gas stream wherein the gas preferably is inert (nonreactive), although any gas that does not react with the metal may be used. The nanoparticles are transported or directed to a water-soluble polymeric film (optionally by the gas stream) and deposited by impinging the metallic vapor onto the film, wherein nucleation and nanoparticle growth occurs. Generally in the absence of a gas stream the physical vapor deposition technique produces a metallic vapor that directly nucleates on the water-soluble polymer substrate surface. In the presence of a gas, the metallic vapor undergoes some degree of homogenous nucleation in the stream to produce the nanoparticles, which are deposited on the polymer substrate surface.

The coating may be prepared by a method comprising the steps:
a) vaporizing a metal, optionally in the presence of a non-reactive gas stream, to provide metallic vapor,
b) optionally providing a second reactive gas capable of reacting with the metallic vapor (or metallic nanoparticles formed in the metallic vapor), and reacting the reactive gas with the metallic vapor (or metallic nanoparticles) to convert the same to metal oxide nanoparticles, and
c) impinging the metallic vapor onto the polymer substrate, wherein nucleation and growth of the nanoparticles occurs, to provide a nanoparticle coating thereon.

The deposition of the metallic nanoparticles on the water-soluble polymer substrate may be achieved using one of several physical vapor deposition techniques known to those of ordinary skill in the art. Such processes include vapor deposition, cathode sputtering, pyrolysis, ion plating, e-beam deposition, and the like. Vapor deposition and cathode sputtering are often preferred in view of the uniformity of structure and thickness that can be obtained. Reference is made to Vacuum Deposition of Thin Films, L. Holland, 1970, Chapman and Hall, London, England with regard to the many available means of providing metal vapors and vapor coating techniques. If desired, the nanoparticle layer may be pattern coated by means of a mask, so that the metallic nanoparticle surface may be patterned.

Physical vapor deposition (PVD) processes involve the deposition of atoms, typically by evaporation or sputtering in a vacuum. PVD processes can be characterized by the steps of (1) generating a metallic vapor by evaporation or sputtering using resistance, induction, electron-beam heating, laser-beam ablation, direct current plasma generation, radio-frequency plasma generation, molecular beam epitaxy, or similar means; (2) transport of the metallic vapor from the source to the substrate by molecular flow, viscous flow, plasma gas transport, or the like; and (3) nanoparticle growth on the water-soluble polymer film, wherein nucleation and growth of the nanoparticles occurs. With PVD a variety of substrate temperatures can be used to control the crystallization and growth mode of the material deposited, although generally the temperature of the water-soluble polymer substrate is below the distortion temperature of the polymer.

To avoid deformation or melting of the substrate during deposition, the polymer substrate is generally maintained at a temperature at or below the distortion temperature of the polymer. The integrity of the polymer substrate is maintained by controlling the deposition rate so that the temperature of the nanoparticles, or the heat released by the nanoparticles upon deposition (heat of condensation) does not lead to thermal deformation of the polymer substrate. Generally, the temperature of the polymer substrate is maintained at ambient conditions of the deposition chamber, and no special cooling of the polymer substrate is required.

In a preferred embodiment, the nanoparticle coatings are applied to the water-soluble polymer film by electron beam evaporation. This technique is based on heat production by high-energy electron beam bombardment on the metal to be deposited. The electron beam is generated by an electron gun, which uses the thermionic emission of electrons produced by an incandescent filament (cathode). Emitted electrons are accelerated towards an anode by a high difference of potential (kilovolts). The crucible (containing the source metal) itself or a near perforated disc can act as the anode. A magnetic field is often applied to bend the electron trajectory, allowing the electron gun to be positioned below the evaporation line. As electrons can be focused, it is possible to obtain a very localized heating on the metallic material to evaporate, with a high density of evaporation power (several kW). This allows control of the evaporation rate, from low to very high values. Cooling the crucible avoids contamination problems from heating and degasification.

Physical vapor deposition by sputtering may be accomplished in a partial vacuum (between 13.3 to 1.33 Pa for a diode system and between 1.3 to 0.13 Pa for a magnetron system) when the target (usually a cathode) is bombarded with gas ions propelled by an electric field. The sputtering gas is typically a noble gas such as argon but the sputtering gas could include reactive elements that can be incorporated into the deposited film such as the deposition of nitrides, oxides and carbides. When the sputtering gas is ionized a glow discharge or plasma is produced. The gas ions are accelerated towards the target by an electric or electric and magnetic fields. Atoms from the target are ejected by momentum transfer and move across the vacuum chamber to be deposited on the substrate (the water-soluble polymer substrate).

In another embodiment, the nanoparticle coatings may be applied to the water-soluble polymer substrate by sputter deposition. The sputtering apparatus generally consists of a three-source magnetron sputtering system arranged around the outer circumference of a cylindrical chamber containing a 38 cm (15 inch) diameter rotating drum. The substrates may be mounted on the drum and rotated sequentially past positions in front of the sputtering sources at rates of between 1 and 8 rpm. The sources are shielded such that the sample is not coated from any two fluxes at the same time. The rate of material deposition and speed of rotation of the substrate in front of the targets determines the individual layer thicknesses comprising the final catalyst particles. Any vacuum pump that can draw a sufficient vacuum may be used. One such vacuum pump is a Varian AV8 cryopump (Varian Associates, Lexington, Mass.), which can be used in conjunction with an Alcatel 2012A rotary vane-roughing pump (Alcatel Vacuum Products, Hingham, Mass.). The cryopump may be partially isolated from the chamber by a butterfly valve. During deposition pressure may be maintained at 0.28 Pa (2.1 millitorr) as the sputtering gas flow rate was controlled by MKS flow controllers (MKS Instruments Inc., Andover, Mass.). Any inert or reactive sputtering gases may be used. Preferably either argon or an argon, oxygen mix is used. Control of the oxygen stoichiometry can be achieved by varying the argon/oxygen flow ratio. Any appropriate targets and power sources may be used. In one embodiment, an Advanced Energy MDX 500 power supply (Advanced Energy Industries, Inc., Fort Collins, Colo.) is used in the constant power mode of the power supply.

Useful metals that may be used in the physical vapor deposition step include, for example, Li, Na, K, Rb, Cs, Fr, Be, Mg, Ca, Sr, Ba, Ra, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Al, In, Tl, Sn, Pb, mixtures, oxides and alloys of these metals and even the lanthanides and actinides, if desired. Metals may be deposited sequentially or simultaneously.

Particularly useful metals are gold, aluminum, copper, iron, platinum, palladium, iridium, rhodium, osmium, ruthenium, titanium, cobalt, vanadium, magnesium, silver, zinc, and cadmium, indium tin oxide (ITO) and antimony tin oxide (ATO), antimony indium tin oxide (AITO), tin, indium, lanthanum, boron, lanthanum hexaboride, rare earth metals and mixtures and alloys thereof, and mixtures and alloys thereof. Most preferred are the noble metals. Other metals are apparent to those skilled in the art.

The process may involve evaporation of the elemental metal itself, as with Au or Ag, or may involve evaporation of a precursor form with generation of the actual elemental metal taking place during the transport stage prior to contacting the polymeric film. An example would be evaporation of silver metal using argon as a nonreactive gas with subsequent exposure of the silver nanoparticles to a reactive oxygen environment, thereby forming ultrafine silver oxide coated nanoparticles (the particle core being silver) prior to contacting the polymeric film. Since the reactive gas is introduced at a site remote from the vaporization source after the nanoparticles have formed, the final nanoparticles consist of a central core and an outer shell, where the central core can be metal and where the outer shell can be comprised of a layer formed by reaction of the reactive gas with the metal nanoparticles.

Where used, the inert gas is generally selected from He, Ne, Ar, Xe, and $N_2$. Mixtures of two or more nonreactive gases can also be used. When modification of the metal is desired, a reactive gas can be introduced through a gas inlet that is positioned so as to minimize reaction with the bulk material in the crucible and allow thorough mixing of the reactive gas with the particles entrained in the gas stream, thereby allowing reaction with the particles to occur. The reactive and nonreactive gases generally are at room temperature but the temperature can be elevated or reduced as desired. The term reactive includes 1) direct reaction with the particles, as in the case of metals, for example, with $O_2$, NO, $NO_2$, $CO_2$, CO, $AsH_3$, $H_2S$, $H_2Se$, $NH_3$, trimethylchlorosilane, methylamine, ethylene oxide, water, HF, HCl, or $SO_2$, or combinations thereof, to form the corresponding oxides or other compounds; or 2) adsorption, in which a volatile substance is introduced in the gas prior to contacting the dispersing medium, but the substance is either not a liquid under normal conditions (atmospheric pressure and 25° C.), the substance is not miscible with the dispersing medium, or else the substance acts to protect the surface of the nanoparticles from the dispersing medium or additives within the dispersing medium. Typical substances that could be adsorbed include polymers such as poly(methylmethacrylate) and polystyrene.

A useful apparatus for coating of the nanoparticles comprises:

a) a furnace connected to a collection vessel, the furnace containing a heating means (e.g., resistive, inductive, e-beam, infrared, laser, plasma jet) and adapted to contain at least a first and optionally a second gas inlet tube, said second tube being located downstream from said first tube, and a means (e.g., a pump such as a rotary oil pump, an oil diffusion pump, piston pump, a Roots™ blower, and a turbomolecular pump) for evacuating the furnace and collection vessel, the vessel containing a dispersing medium;

b) means (e.g., a ceramic, or metal crucible or slab that can be preloaded with metal or which can be continuously or batch-wise fed during operation of the apparatus, or the electrodes can be the means) for introducing a metal into said furnace and evacuation thereof;

c) optionally, means (e.g., a micro metering valve, electronic flow controller, or gas dispersing tube) for introducing through the first inlet tube a first, non-reactive gas stream into the furnace;

d) means (e.g., energy input as by e-beam, infrared, laser, inductive, resistive, or plasma jet) for evaporating the metal nanoparticles into the first gas stream;

e) means for allowing condensation of the vaporized metallic nanoparticles (e.g., decreasing the temperature, raising the pressure, changing the chemical nature of the nonreactive gas, controlling the length of the transfer tube, controlling the gas flow rate, or combinations thereof) in the first gas stream to produce a dispersion of nanoparticles into the first gas stream;

f) optionally, means (e.g., a micro metering valve, electronic flow controller, or gas dispersing tube) for introducing into the furnace through the second inlet tube a second, reactive gas stream, to allow reaction with the metallic nanoparticles;

g) means for impinging the nanoparticles onto the thermoplastic polymer film.

Other reactor designs to provide dispersions of the invention can be envisioned, including a rotary metal atom reactor such as described in Metal Vapour Synthesis in Organometallic Chemistry, J. R. Blackborow and D. Young, Springer-Verlag (New York), 1979 and a spinning disk assembly such as described in Jpn. J. Appl. Phys., 13, 749 (1974). Both types of reactors could be used to generate dispersions of organic pigments. In addition to resistive heating, other means of applying heat to the pigment or pigment precursor may be envisioned. These include laser heating, inductive heating, plasma jet, plasma arc discharge, and others known to those skilled in the art.

With the process of the invention, no milling or chemical reduction processes are required in order to achieve the fine particle sizes obtained in the final coating. The nanoparticles of the present invention exhibit useful optical properties as demonstrated by the tunable or controllable absorbance spectra.

To preserve the desirable optical and electronic properties of the nanoparticle—coated article, it is preferred that the water-soluble polymer substrate contain substantially no particulate additives such as pigments, fillers, reinforcing agents. Such additives, when present, can adversely affect the absorbance, alter the dielectric properties of the water-soluble film and increase light scattering. Generally, such additives, if present, are less than 5 wt. %, preferably less than 1 wt. %, of the water-soluble polymer substrate.

However, in some embodiments is may be desirable for the nanoparticle coated article to further comprise a dye or pigment for sensitizing the metallic nanoparticles to a particular wavelength of incident light. Such sensitizers may be coated on the nanoparticle-coated article before or after stretching, rather than embedded or dispersed in the polymer matrix. Such sensitizers are normally used at less than 1 wt. %, relative to the weight of the metallic nanoparticles.

The water-soluble polymer substrate, such as films and fibers, may be stretched before or after deposition of the metallic nanoparticles. It will be understood however that whether the film is stretched or unstretched prior to nanoparticle deposition, the coated film may be subsequently stretched (or shrunk) to provide the desired absorption spectrum. Thus a stretched film may be coated with nanoparticles, and then further stretched, or preferably an unstretched film is coated with nanoparticles, then stretched. Generally the stretch imparts a permanent deformation to the water-soluble substrate so that the dimensions (length and/or width) are increased, although permanent deformation is not required for the desired effect.

The stretching increases (or shrinking decreases) the inter-particle distance and shifts the absorbance peak maximum (to shorter or longer wavelengths respectively). In optical filter applications, this enables one to adjust the absorbance to a preselected maximum, so as to most efficiently filter out undesired wavelengths such as UV or IR wavelengths. In sensor applications, it allows one to match the absorbance peak maximum to a particular analyte and thereby maximize the response signal. Generally, the substrate is stretched (or shrunk) in an amount sufficient to shift the absorbance peak maximum of the coated article at least 10 nanometers, preferably at least 20 nanometers.

The water-soluble polymer substrate may be stretched along one major axis (uniaxial), and may further be stretched along two major axes (biaxial). The stretching may be sequential or simultaneous. The degree of stretching is generally defined by the draw ratio, that is, the ratio of the final area to the original area. This stretching may be effected by a combination of techniques in the present invention, including the steps of calendering and length stretching. In general, the total draw ratio is at least 1.1×, and preferably at least 5×.

The conditions for stretching are chosen such that the desired shift in the absorption peak maximum is achieved and the integrity of the film is maintained. Thus when stretching in the machine and/or transverse directions, the temperature is chosen such that substantial tearing, distortion or fragmentation of the film is avoided and integrity is maintained. The film may be vulnerable to tearing or even catastrophic failure if the temperature is too low, or the stretching ratio(s) is/are excessively high. Preferably, the stretching temperature is above the glass transition temperature of the polymer. Such temperature conditions permit stretching in the X and Y directions without loss of film integrity.

When stretched, the polymeric substrate may also be allowed to dimensionally relax in the cross-stretch direction from the natural reduction in cross-stretch (equal to the square root of the stretch ratio) or may also be constrained (i.e., no substantial change in cross-stretch dimensions). The substrate may be stretched in the machine direction, as with a length orienter, and in the width direction using a tenter, or at diagonal angles.

It will be understood with respect to such stretching and orientation processes, that the pre-stretch temperature, stretch temperature, stretch rate, stretch ratio, heat set temperature, heat set time, heat set relaxation, and cross-stretch relaxation are selected to yield a film having desired properties, including a desired refractive index relationship.

If the stretching of the nanoparticle coated article is not equal in the transverse and longitudinal directions of the film, the article will exhibit different optical properties along the two major axes. This may result from uniaxial stretching, or from unequal biaxial stretching, where the stretching along one axis is greater than stretching along the other. It is preferred that the stretching is biaxial, and substantially equal on both axes, i.e. stretching along one axis is within 20% of stretching along the other axis.

If desired, the coated article may be annealed, preferably after stretching at a sufficient temperature to relieve stress but not so long or at so high a temperature that degradation of the film results. Suitable annealing temperatures vary with the type of polymer used. Preferably no pressure is applied to the film during the annealing step, only heat, although slight pressure less than about 10 psi is not detrimental. Ordinarily the film to be annealed is merely laid on a non-adherent support around which hot air is circulated or over which radiant heaters are placed.

The method may also comprise a step of shrinking the nanoparticle-coated water-soluble polymer substrate. Upon shrinking, the interparticle distance is reduced, and the absorbance peak maximum is shifted to longer wavelengths. In optical filter applications, this enables one to adjust the absorbance to a preselected maximum, so as to most efficiently filter out undesired wavelengths such as UV or IR wavelengths. In sensor applications, it allows one to match the absorbance peak maximum to a particular analyte and thereby maximize the response signal.

The present invention provides a shrinkable water-soluble polymeric film, having a discontinuous metallic nanoparticle coating onto a portion of the polymeric film. The temperature of the shrinkable, coated polymeric film is elevated such that the projected surface area of the polymeric film shrinks by an amount sufficient that the absorbance peak maximum is shifted by at least 10 nanometers, preferably at least 20 nanometers. The step of shrinking may comprise exposing the shrinkable coated article to an elevated temperature for a time sufficient such that the article shrinks to less than 50 percent of its original projected surface area, sometimes less than 10 percent of its original projected surface area, and in certain embodiments less than 5 percent of its original projected surface area. During the shrinking step, it is advantageous to maintain the nanoparticle coated shrinkable film substantially flat to avoid uneven shrinkage, curling or other undesired deformation. The shrinkable film may be held in a tenter apparatus, or between two planar surfaces, during the heat shrinking.

In general, the nanoparticle-coated film is shrunk to provide the desired shift in the absorption spectrum. It should be recognized that excessive shrinking might lead to continuity between the previously discontinuous nanoparticles (and agglomerates), with an increase in electrical conductivity, reflection, and a loss or reduction in the surface plasmon resonance.

"Shrinkable," "shrinking" or "shrunk" shall mean, in the context of a material such as a substrate, that the material is capable of being, is, or has been decreased in its length in at least one dimension, whether by recovery, relaxation, or any other means. Percent shrinkage of the substrate is calculated using the following equation: percent shrinkage=100 percent×[pre-shrinking projected surface area−post-shrinking projected surface area]/pre-shrinking projected surface area. The nanoparticle coated polymeric shrink film substrate is typically shrunk using a heat source, such as by convection or contact heating. Also, in some implementations the heating process may be performed by microwave, radio frequency or infrared radiation.

If desired, the article may further comprise a protective layer for isolating the nanoparticles from environmental effects and mechanical stresses. The additional protective layer may be in contact with the metallic nanoparticle layer and the exposed surface of the water-soluble film layer (i.e. the uncoated regions). This layer can act to reduce the surface roughness of both the polymeric layer and the overall construction, maintain the clarity and low haze of the article, and protect the nanoparticle layer from abrasion or oxidation. The protective layer may also be used to impart scratch resistance, chemical resistance and/or increased weatherability. The protective layer can be coextruded onto the surfaces of the coated surface of the water-soluble film layer. Alternatively, the protective layer can be coated or laminated onto the water-soluble film layer using a suitable pressure sensitive or non-pressure sensitive adhesive. Suitable protective layers include, but are not limited to hardcoats, adhesives, antistatics, adhesion promoting primers, UV stabilizing coating, friction reduction layers, etc. The protective layers are preferably made of a transparent polymer, for example, polyester (the same or different as that used in the construction of the thermoplastic polymer film layer.

The nanoparticle-coated article may be characterized as a water-soluble polymer film having a discontinuous coating of nanoparticles or agglomerates of nanoparticles on the surface thereof and that the article generally exhibits a surface plasmon resonance. The maximum average thickness of the coating is less than 100 nanometers, preferably less than 10 nanometers with areas of nanoparticles or agglomerates thereof and uncoated areas. Above approximately 100 nanometers the coating tends of behave as a continuous metalized film, which do not exhibit a surface plasmon resonance. It will be understood that the interparticle distance may be controlled during deposition, or subsequently by stretching or shrinking of the water-soluble polymer substrate.

If desired, a multilayer article comprised a plurality of nanoparticle coated films may be used. The films may be bonded or otherwise affixed to adjacent layers, or may comprise a stack of nanoparticle coated films. The multilayer articles increase the total absorbance (an additivity of absorbance) while maintaining the surface plasmon resonances, which is generally not possible by increasing the nanoparticle coating thickness. The multilayer article further shows an internal reflectance between layers, which results in an interference fringe.

The particles are partially fixed on the surface of the water-soluble film and exposed, rather than embedded therein. Electron micrographs of a cross section of the coated film indicate the nanoparticles are substantially above the plane of the film. Generally more than 50%, typically more than 75%, of the volume of the nanoparticles are above the surface. The particles remain fixed on the surface and are not easily removed. Typically less than 5% of the particles are removed by a tape test in which adhesive tape is affixed to the surface, and then peeled off at 180 degrees.

Other physical forms of the water-soluble polymer substrate (e.g. fibers, nonwovens, microporous or porous films) may exhibit a different cross section. After deposition of the discontinuous nanoparticle coating onto a microporous, porous or nonwoven substrate, some of the metallic nanoparticles are partially affixed on the major surface of the substrate and exposed when viewed perpendicular to the major surface. As physical vapor deposition processes are "line of sight" processes, a minority (less than 50%) of the nanoparticles may be found within the pores below the major surface, but in immediate communication with the atmosphere.

For example, the article of the invention may comprise a water-soluble nonwoven substrate. Advantageously, the high surface area (relative to film) aids in the dissolution of the polymer substrate. Polyvinyl alcohol nonwoven substrates may be made according to U.S. Pat. No. 5,656,333 (Truong et al.) and references therein, incorporated here by reference.

The nanoparticle coating used in the present invention avoids contamination of dispersed material due to the presence of milling media and the wear of mechanical parts; these problems having been noted above for dispersions prepared by conventional methods employing mechanical grinding of particulates. Additionally, no chemical reduction process is required in order to achieve the fine particle sizes obtained in the final coating; the solvents and reducing agents employed may contaminate the nanoparticles.

The absorption peak maximum of the coated article is a function of the metal or metallic compound deposited, the average thickness, the average particle size and shape (including agglomerates), the polymer used as the substrate and the degree of stretching (or shrinkage) of the article. As more metallic nanoparticles are deposited on the film and the average thickness increases, the absorption spectrum broadens and the maximum shifts to longer wavelengths. Electron micrographs reveal that as the mass thickness increases, the average particle size increases and the space (uncoated areas) between nanoparticles decreases as result of agglomeration. The average thickness may be controlled by the deposition rate and the time of deposition (the time the film is exposed to the metallic vapor). Several methods are available for characterizing the coating. The most common involves the mass thickness expressed as the average thickness of the nanoparticle coating.

The surface plasmon resonance and the absorption spectrum may be measured by spectrophotometry. As the absorption peak maximum of the spectrum shifts in response to stretching or shrinking, (or by controlling the aforementioned factors) the surface plasmon absorption spectrum of the metallic material may be measured by any suitable means for detection of transmitted light. Suitable means include UV-vis spectrophotometers, such as those available commercially from companies such as Beckman Coulter (DU Series 500 Scanning Spectrophotometers and DU Series 600 High Performance Spectrophotometers), Spectral Instruments (400 Series spectrometers), Varian Instruments (Cary 300 Bio spectrophotometer), Safas Monaco (UVmc series spectrophotometers and D.E.S. spectrophotometers), Hitachi Instruments (U3010/3310 spectrophotometers) and others. Other means for detection of transmitted light include CCD cameras and flatbed optical scanners, which are also commercially available, such as a UMAX super vista S-12 flatbed scanner (UMAX Technologies, Inc.), preferably in combination with means for converting the image to grey scale and/or means for determining the density of an image, such as Scion Image software (Scion Corp).

The nanoparticle coated water-soluble polymer substrate is a convenient means of storing nanoparticles, and is particularly useful in the preparation of stable, aqueous metallic nanoparticle dispersions. Surprisingly, the water-soluble polymer acts as a stabilizer to prevent agglomeration and precipitation of the nanoparticles. Such suspensions have been observed to be stable for a period of a year with no evidence of settling. The dispersions overcome problems in the art inherent in using thiol stabilizers.

The nanoparticle-coated water-soluble article may be contacted with water or an aqueous solvent at a temperature, and for a time sufficient, so that the water-soluble polymer substrate dissolves yielding a stable aqueous dispersion. Normally, heating is not required, although agitation may be used. Agitation means may include, but is not limited to shaking, stirring and ultrasonic agitation. Organic solvents may be used in combination with water to yield the aqueous dispersions. Thus the present invention provides an aqueous dispersion of metallic nanoparticles containing a water-soluble polymer that may be used to coat secondary substrates.

Although not required, a dispersing aid or surfactant may be used to improve the stability of the nanoparticle/water-soluble polymer dispersion. Suitable dispersing aids include organosilanes, organic acids such as carboxylic acids, alcohols, polyethylene glycols, mono- or di-esters of fatty acids, organophosphates, organosulfonates, polyethylene oxide and polypropylene oxide, or combinations thereof.

A preselected concentration of nanoparticles in water may be achieved by judicious selection of the amount of nanoparticle-coated substrate and amount of water. Water may be added or evaporated as desired to yield a desired concentration of nanoparticles. The dispersion may be used to coat other secondary substrates (i.e. substrates other than the original water-soluble polymer substrate), such as glass substrates. The article may be prepared by coating the secondary substrate with the aqueous suspension of nanoparticles (containing dissolved water-soluble polymer), followed by drying the resulting coating. The resulting article comprises a substrate bearing a nanoparticle coating in a water-soluble polymer matrix. If desired, the water-soluble polymer may be crosslinked.

The secondary substrate can be made of any suitable material and can be chosen from a wide variety of films, sheets, wafers, and other surfaces, depending upon the particular end-use application. Useful secondary substrates include inorganic substrates such as metals, glass, ceramic, silicon and ITO and organic substrates including thermoplastic and thermoset polymers such as polyolefins, polyethersulfones, polycarbonates, polyesters, polyarylates, polyimides, polymeric multilayer films, and organic/inorganic composite multilayer films. Flexible rolls or sheets of glass can also be used. For many optical applications substrate material desirably transparent, or can also be opaque to visible light such as, for example, stainless steel, crystalline silicon, poly-silicon, or the like. The substrate can optionally be pre-treated with a primer (for example, silane coupling agents) to enhance adhesion of nanoparticles.

Advantageously, the present article and processes allow one to prepare other nanoparticle-coated substrates that are not normally amenable to vapor deposition techniques, due to the nature or shape of the desired secondary substrates.

The nanoparticle-coated article may be used as a sensor in analytical applications. In one embodiment a sensor comprises the nanoparticle coated water-soluble film and a binding agent disposed over at least a portion of the nanoparticle coating. In another embodiment the sensor may comprise a nanoparticle coated secondary substrate (such as a glass substrate) and a binding agent disposed over at least a portion of the nanoparticle coating, prepared as described herein The binding agent interacts with a predetermined substance present in the biological, biochemical, chemical or environmental solution being tested with the sensor of the present invention. Any suitable reactive substance may be employed in the present invention, provided that it does not deleteriously affect either the metallic material or the optically transparent substrate.

According to certain preferred embodiments of the present invention, the binding agent is an agent involved in biological binding with at least one predetermined substance present in the biological, biochemical, chemical or environmental sample being tested. As used herein, the term "biological binding" is intended to mean the interaction between a corresponding pair of molecules that exhibit mutual affinity or binding capacity, typically specific or non-specific binding or interaction, including biochemical, physiological and/or pharmaceutical interactions, such as pairs of proteins, nucleic acids, glycoproteins, carbohydrates, hormones and the like. Illustrative examples of such corresponding pairs or molecules include, but are not limited to, the following: antibody/antigen; antibody/hapten; enzyme/substrate; enzyme/cofactor; enzyme/inhibitor; binding protein/substrate; carrier protein/substrate; lectin/carbohydrate; receptor/hormone; receptor/effector; nucleic acid strand/complementary nucleic acid strand; protein/nucleic acid repressor or inducer; ligand/cell surface receptor; and virus/ligand.

If desired, a functionalized material may be used to improve the adherence of the binding agent to the metallic nanoparticles and/or thermoplastic film layer. Accordingly, any material that adheres to both the metallic material and/or thermoplastic film layer, and the binding agent, but is not deleterious to either, may be employed as the second functionalized material. Suitable compounds for use as the second functionalized material are known to those skilled in the art and include, for example, organic compounds containing one or more of the functional groups including phosphonic acids, benzotriazoles, azlactones, —COOH, —CN, —NH$_2$, 2-pyridyl, —P(C$_6$H$_5$)$_2$ and/or —SH. Particularly preferred examples of a second functionalized material are carboxyl-terminated organothiols, such as 3-mercaptopropionic acid.

The choice of a particular functionalized material to be employed in such an embodiment of the present invention will therefore depend, at least in part, upon the particular metallic material and specific reactive substance employed. Accordingly, the choice of a particular second functionalized material may be determined empirically by one skilled in the art, in view of the particular metallic material and reactive substance being used.

When used as a sensor, it is preferred that the water-soluble polymer substrate (or optionally the secondary substrate) be substantially transparent. As used herein, the term "substantially transparent" is intended to mean a substance that permits transmission of at least 50% of the light in the ultraviolet region (about 200 to about 400 nanometers), visible region (about 400 to about 750 nanometers), or infrared (greater than about 750 nanometers) of the spectrum.

The sensor(s) of the present invention are preferably employed in combination with a means for detection of transmitted light in the ultraviolet region (about 200 to about 400 nanometers), visible region (about 400 to about 750 nanometers) and/or infrared region (greater than about 750 nanometers) of the spectrum. Commercially available examples of such means for detection of transmitted light include, but are not limited to, UV-vis spectrophotometers, infrared spectrometers and flatbed optical scanners.

One preferred embodiment of the present invention is directed to a plurality of the sensors arranged in an array format. According to such an embodiment, an array of sensors is preferably employed in combination with a means for detection of transmitted light in the ultraviolet region (about 200 to about 400 nanometers) and/or visible region (about 400 to about 750 nanometers), such as a flatbed optical scanner or CCD camera, or the infrared region of the spectrum (greater than about 750 nanometers). Such an embodiment of the present invention is particularly useful for use in an end-point-assay or as a screening tool in combinatorial chemistry, proteomics and/or genomics.

The present invention further provides an optical element for selective absorption and transmission of incident light, including polarized light. Advantageously, the absorption spectrum of the nanoparticle-coated article may be controlled by appropriate stretching or shrinking of the article. The optical film of the invention can be used in any application to provide selective absorption, transmission and reflection. The optical film can incorporate or be applied to other optical bodies or films to combine multiple optical effects. For example, the optical bodies can be incorporated along with one or more additional optically active layers to form an IR mirror, UV absorption construction, solar control construction, polarizer, or decorative construction. When the article comprises a water-soluble polymer film substrate, such as nanoparticle coated vinyl alcohol polymers, the vinyl alcohol polymer substrate may be used as an adhesive for affixing the article to a secondary substrate, such as window glass.

Similarly, the optical element of the invention can be used to provide optical filters to window glazing, and lenses made of glass or polycarbonates. The optical element may also find application in the construction of puncture or tear-resistant films, safety and security films, and as contrast enhancement layers for optical displays, for example, computer monitors, television screens, and the like.

EXAMPLES

These examples are merely for illustrative purposes only and are not meant to be limiting on the scope of the appended claims. All parts, percentages, ratios, etc. in the examples and the rest of the specification are by weight, unless noted otherwise. Solvents and other reagents used were obtained from Sigma-Aldrich Chemical Company; Milwaukee, Wis. unless otherwise noted.

Table of Abbreviations

| Abbreviation or Trade Designation | Description |
| --- | --- |
| PVA Film | Polyvinyl alcohol film 40 micrometers thick commercially available under the name SOLUBLON from Mitsui Plastics, White Plains, NY. |
| Glass Slide | Glass slide with a thickness of 0.2 millimeters commercially available from VWR Scientific; West Chester, PA. |

Example 1

Silver nanoparticles were e-beam evaporated onto PVA Film at a nominal thickness of 40 Angstroms. The e-beam deposition rate was 5 Angstrom/second. The resulting coated films had a yellowish/amber tint. A spectrum was taken using a UV-Vis HP 8452A. Rev.A spectrophotometer with a sampling interval of 2 nanometers and integration time of 0.5 seconds which showed the nanoparticle resonance at 412 nanometers as shown in FIG. 1. A sample of 0.9 grams of coated film was dissolved in 157 grams of distilled water at room temperature to make a stock solution. Additional solutions were made by further diluting to 50 and 25% samples of the stock solution with distilled water. It was noted these solutions were stable for over a year, with no evidence of agglomeration.

Figure 2:
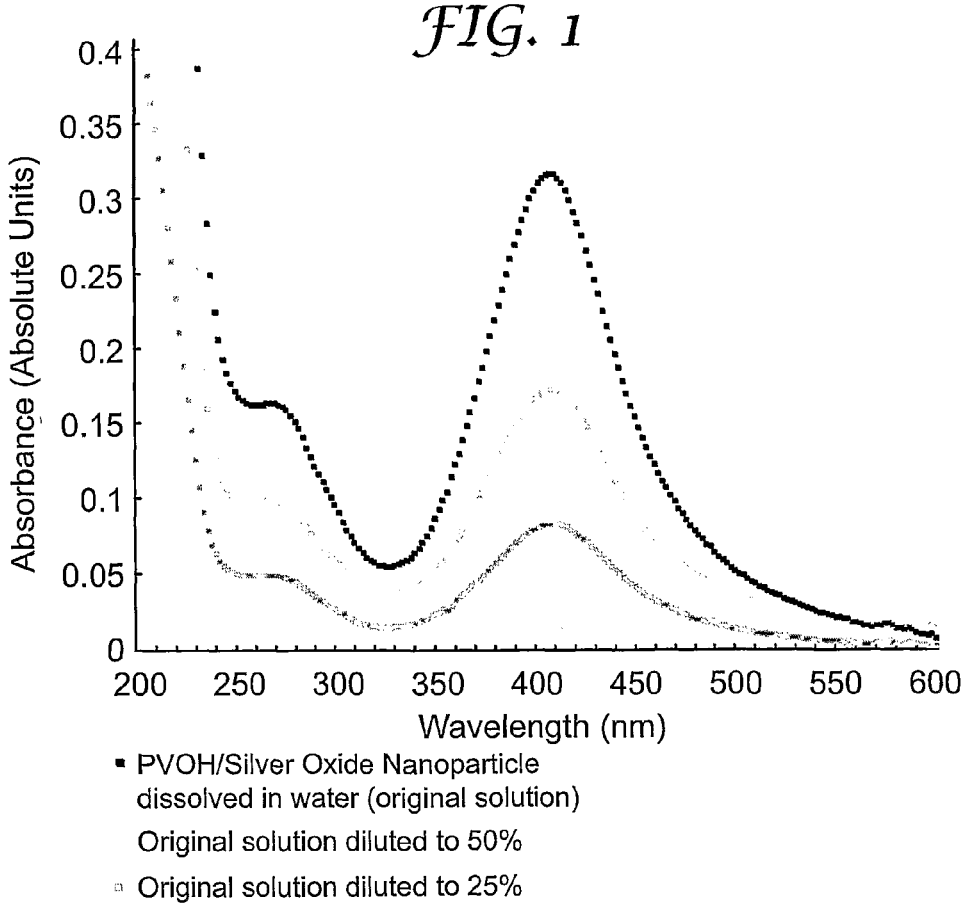
Figure 3:
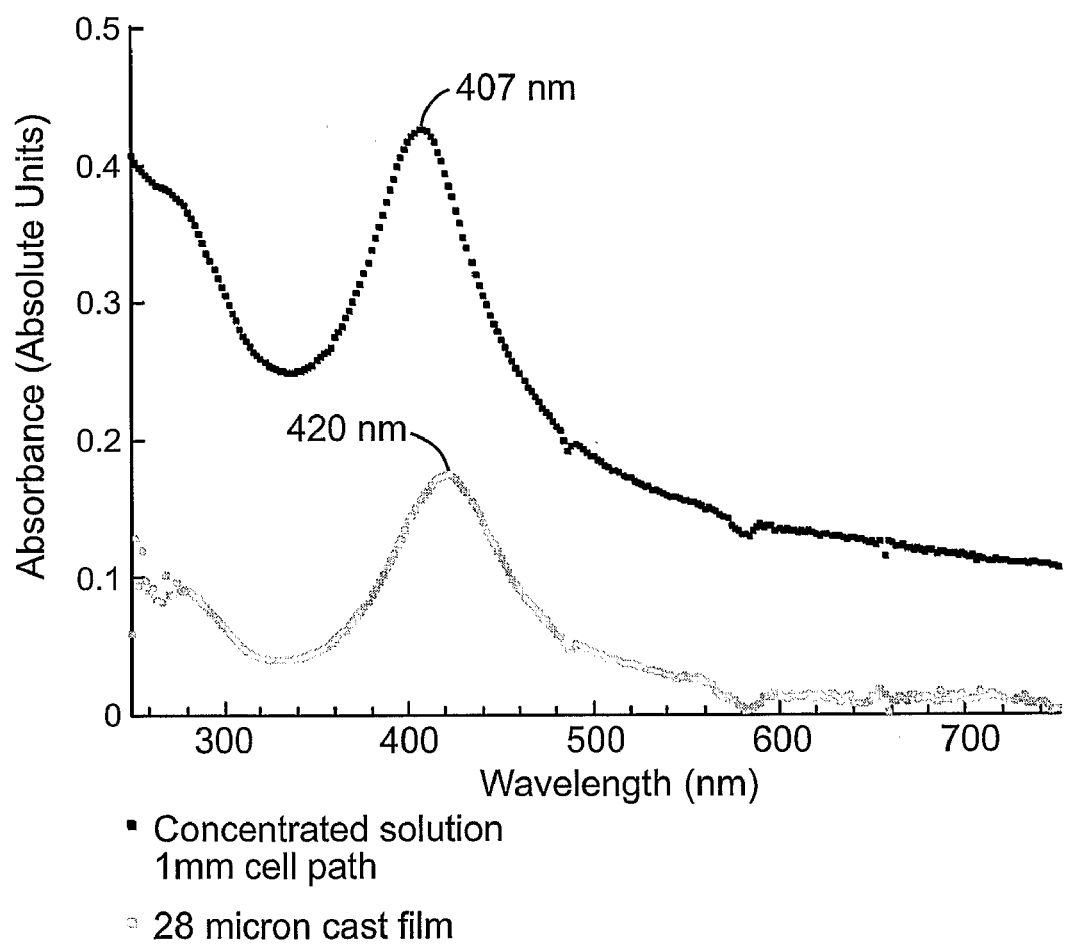

Spectra were run of these solutions in cells with a path length of 1 centimeter. The results are shown in FIG. 2. A sample of the stock solution was evaporated to yield a very viscous liquid. A spectrum was run of this liquid in a sample cell with a path length of 1 millimeter. The viscous liquid was coated on a Glass Slide and dried completely to yield a 28 micrometer coating. A spectrum was run of this dried cast film with nanoparticles. The results are shown in FIG. 3 along with the spectra of the viscous precursor solution.

The invention claimed is:
1. An article comprising a water-soluble polymer substrate and a discontinuous coating of vapor deposited metallic nanoparticles thereon, wherein said water-soluble polymer is selected from the group consisting of vinyl alcohol polymers, poly(aspartic acid), poly(acrylic acid), poly(methacrylic acid), poly(vinyl pyrrolidone), poly(alkylene oxide)s, poly(vinyl methyl ether), sulfonated polyesters, complex carbohydrates, guar gum, gum arabic, gum tragacanth, larch gum, gum karaya, locust bean gum, agar, alginates, caragheenan, pectins, cellulose derivatives, and combinations thereof, wherein the absorption peak maximum of said article shifts at least 10 nm as the water-soluble polymer substrate is further stretched or shrunk.

2. The article of claim 1 wherein said water-soluble polymer substrate is stretched.

3. The article of claim 1 wherein the metallic nanoparticles comprise individual particles or agglomerates of particles having an average major dimension of less than 100 nanometers.

4. The article of claim 1, wherein said nanoparticles have an aspect ratio of greater than 1.5:1.

5. The article of claim 1 wherein the water-soluble polymer is a vinyl alcohol polymer of the formula:

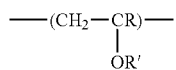

wherein R is H, a $C_1$-$C_8$ alkyl, or an aryl group; and R' is H, or a hydrolysable functional group.

6. The article of claim 1 having a surface plasmon resonance.

7. The article of claim 1 further comprising a protective layer.

8. A method for preparing a metallic nanoparticle coated film of claim 1 comprising:
a) providing a water-soluble polymer substrate, wherein said water-soluble polymer is selected from the group consisting of vinyl alcohol polymers, poly(aspartic acid), poly(acrylic acid), poly(methacrylic acid), poly(vinyl pyrrolidone), poly(alkylene oxide)s, poly(vinyl methyl ether), sulfonated polyesters, complex carbohydrates, guar gum, gum arabic, gum tragacanth, larch gum, gum karaya, locust bean gum, agar, alginates, caragheenan, pectins, cellulose derivatives, and combinations thereof, and
b) depositing a discontinuous coating of metallic nanoparticle on the surface of the substrate by physical vapor deposition to form a nanoparticle-coated water-soluble polymer substrate.

9. The method of claim 8 further comprising the step of stretching said water-soluble polymer substrate after said step of depositing.

10. The method of claim 8 further comprising the step of shrinking said water-soluble polymer substrate after said step of depositing.

11. The method of claim 8 wherein the maximum average thickness of said nanoparticle coating is less than 100 nanometers.

12. The method of claim 8, further comprising the step of annealing said nanoparticle-coated water-soluble polymer substrate.

13. The method of claim 8 wherein said metallic nanoparticles are deposited in a preselected pattern.

14. A method of providing a stable nanoparticle dispersion comprising contacting an article with an aqueous solvent, the article comprising a water-soluble polymer substrate and a discontinuous coating of metallic nanoparticle thereon of claim 1.

15. The method of claim 14 wherein further comprising the step of agitation.

16. An aqueous nanoparticle dispersion comprising metallic nanoparticles and a water-soluble polymer comprising a result of contacting a metallic nanoparticle-coated water-soluble polymer substrate of claim 1 with aqueous solvent.

17. A method of providing a nanoparticle coating on a substrate comprising;
a) providing a substrate and the nanoparticle dispersion of claim 16,
a. contacting the substrate with the nanoparticle dispersion,
b. drying the resulting coated substrate to remove the aqueous solvent.

18. The method of claim 17 wherein said substrate is selected from metals, glass, silicon and ITO, woven and nonwoven fabrics, and thermoplastic and thermoset polymers.

19. The method of claim 17 wherein said substrate has surface plasmon resonance after deposition.

20. An optical article exhibiting surface plasmon resonance comprising the metallic nanoparticle-coated water-soluble polymer substrate of claim 1, wherein the absorption peak maximum may be adjusted by stretching or shrinking of the article,
wherein stretching increases the interparticle distance and shifts the absorbance maximum to shorter wavelengths, and
wherein shrinking decreases the interparticle distance and shifts the absorbance peak maximum to longer wavelengths.

21. A sensor for biological, biochemical, chemical or environmental samples comprising the metallic nanoparticle coated water soluble polymer substrate of claim 1, wherein a binding agent is disposed over at least a portion of said metallic nanoparticle coating and wherein said binding agent interacts with a predetermined substance present in said sample.

* * * * *

UNITED STATES PATENT AND TRADEMARK OFFICE
CERTIFICATE OF CORRECTION

PATENT NO. : 7,935,540 B2
APPLICATION NO. : 11/995299
DATED : May 3, 2011
INVENTOR(S) : Rajdeep S Kalgutkar It is certified that error appears in the above-identified patent and that said Letters Patent is hereby corrected as shown below:

Title Page; item (56);
Page 2, Column 2,
Under "Other Publications," line 2, delete "Interation"," and insert -- Interaction", --.

Column 5,
Line 16, delete "caragheenan," and insert -- carrageenan, --.
Line 38, delete "alignic" and insert -- alginic --.
Line 42, delete "al.")." and insert -- al.) --.

Column 6,
Line 12, delete "solubity." and insert -- solubility. --.

Column 16,
Line 45, delete "herein" and insert -- herein. --.

Column 19,
Line 5, delete "caragheenan," and insert -- carrageenan, --.
Line 41-42, delete "caragheenan," and insert -- carrageenan, --.

Signed and Sealed this
Ninth Day of August, 2011

David J. Kappos
*Director of the United States Patent and Trademark Office*